(12) United States Patent
Bellezza

(10) Patent No.: US 10,096,761 B1
(45) Date of Patent: Oct. 9, 2018

(54) THERMOELECTRIC DEVICE ASSEMBLY WITH FUSION LAYER STRUCTURE SUITABLE FOR THERMOELECTRIC SEEBECK AND PELTIER DEVICES

(71) Applicant: Anthony Paul Bellezza, Parkesburg, PA (US)

(72) Inventor: Anthony Paul Bellezza, Parkesburg, PA (US)

( * ) Notice: Subject to any disclaimer, the term of this patent is extended or adjusted under 35 U.S.C. 154(b) by 0 days.

(21) Appl. No.: 15/608,674

(22) Filed: May 30, 2017

(51) Int. Cl.
    *H01L 35/34* (2006.01)
    *H01L 35/16* (2006.01)
    *H01L 35/32* (2006.01)

(52) U.S. Cl.
    CPC .............. *H01L 35/32* (2013.01); *H01L 35/16* (2013.01); *H01L 35/325* (2013.01); *H01L 35/34* (2013.01)

(58) Field of Classification Search
    CPC ........ H01L 35/32; H01L 35/16; H01L 35/325; H01L 35/34
    See application file for complete search history.

(56) References Cited

U.S. PATENT DOCUMENTS

2016/0064638 A1* 3/2016 Salvador ............... H01L 35/325
    136/230

* cited by examiner

*Primary Examiner* — Seahvosh Nikmanesh
(74) *Attorney, Agent, or Firm* — Lyman Smith; Patent Service Associates

(57) ABSTRACT

A solderless thermoelectric device is capable of use at higher operating temperatures as compared to conventional low temperature solders thus allowing the thermoelectric device to be used in a Seebeck device, for example. The thermoelectric device forms a fusion layer between a copper metal layer and a semiconductor wafer layer by impregnating and surface coating graphene on the semiconductor wafer and heating, under pressure, the graphene coated semiconductor wafer to create a true metallurgical bond of the layers with superconducting interfaces and good thermoelectric properties.

16 Claims, 4 Drawing Sheets

ID1,096,761 B1

THERMOELECTRIC DEVICE ASSEMBLY WITH FUSION LAYER STRUCTURE SUITABLE FOR THERMOELECTRIC SEEBECK AND PELTIER DEVICES

BACKGROUND OF THE INVENTION

1. Field of the Invention

One or more embodiments of the invention relates generally to thermoelectric devices. More particularly, the invention relates to solderless thermoelectric devices that provide a true metallurgical bond of the device layers with superconducting interfaces and proper thermoelectric properties that are needed for electrical generation devices (Seebeck devices) and cooling devices (Peltier devices).

2. Description of Prior Art and Related Information

The following background information may present examples of specific aspects of the prior art (e.g., without limitation, approaches, facts, or common wisdom) that, while expected to be helpful to further educate the reader as to additional aspects of the prior art, is not to be construed as limiting the present invention, or any embodiments thereof, to anything stated or implied therein or inferred thereupon.

The performance and reliability of thermoelectric devices is critical when serving the power, refrigeration and emerging semiconductor markets.

A nickel "diffusion barrier" coating, in combination of a variety of solders, is currently used to join the layers of thermoelectric devices. Electroplated and Electro-less nickels fail to protect the semiconductors from contamination due to micro-cracking in thermoelectric refrigeration devices and delamination in thermoelectric generators. Solders fail to withstand high currents, melt under high temperatures, crack and delaminate under the mechanical stress of low temperatures, fail to support superconductivity and produce high electrical resistivity.

As can be seen, there is a need for a fused junction that supports superconductivity and blocks further migration of metals into the thermoelectric semiconductor. These junctions should exhibit mechanical tenacity under operating extremes of high electrical current and high and low temperatures.

SUMMARY OF THE INVENTION

Embodiments of the present invention provide a solderless thermoelectric device can has applications in Peltier and Seebeck devices, for example. As compared to low temperature solders currently used in the art, the bond between layers in the thermoelectric devices of the present invention can withstand higher operating temperatures. Moreover, the fusion methods as described herein do not contaminate the solder metals into the semiconductor, as may be the case in conventional methods.

The thermoelectric devices of the present invention are fused together by a true metallurgical bond of the device layers to provide a superconducting interface and the proper thermoelectric properties needed for Seebeck and Peltier devices.

By impregnating graphene into the semiconductors, oxidation of the semiconductor can be prevented. Graphene acts as a metal diffusion barrier and is a significant improvement over nickel diffusion barriers currently used in the art. In addition, graphene has the ability to self-repair its superconducting web structure and can withstand many thermo cycles during the life operation of Seebeck and Peltier devices, for example. Graphene can be used in a carbonization of martensitic to austenitic structure when impregnated into semiconductors of thermoelectric devices.

Any and all metals that phase change from martensitic to austenitic while being heat treated can be used to carbon bond the semiconductors to the phase change metal or material. An electroplated nickel/iron metal is used in the examples discussed herein.

An ideal substrate material is one with low electrical resistance and a good conductor of heat. Copper is used as a substrate material in the examples discussed herein.

Generally, embodiments of the present invention solve the problem of carrying high electrical currents through a series of interfaces of a thermoelectric device at high and low temperatures with minimal electrical resistance. Embodiments of the present invention also maintain the electrical performance of the thermoelectric semiconductor by impregnating graphene carbon molecules, which bond with the crystalline structure of the thermoelectric semiconductor, which also acts as a diffusion barrier, protecting the thermoelectric semiconductor from metal contamination and providing a junction that will withstand stresses caused by mechanical bending as well as high temperature gradients.

Embodiment of the present invention provides additional unique features required by high temperature thermoelectric generators.

It is a further objective of the present invention to provide a solder-less thermoelectric device for both Seebeck applications and Peltier applications.

It is a further objective of the present invention to use true metallurgical fusion of thermoelectric interfaces that do not require solders that interfere with the thermoelectric effects by creating layers of metal between the intended contact of P-Type and N-Type thermoelectric interfaces.

It is a further objective of the present invention to solve the limitations of both Peltier and Seebeck devices and allow continuous use of operating devices for many years.

It is a further objective of the present invention to utilize carbon structures as diffusion barriers that prevent the migration of metals into each other, and also prevent the contamination of the materials in thermoelectric semiconductor devices.

It is a further objective of the present invention to utilize carbon to protect against oxidation of the metals in the thermoelectric semiconductor devices The formation of fusion interfaces between the graphene carbon and a metal component is the major breakthrough of the present invention. The metal-graphene carbon fusion requires the metal component to want carbon in its crystalline lattice. This condition exists when a metal that is in the allotropic martensitic state is transformed to the austenitic state. One such metal is class 300 Stainless Steel, for example. This metal can be brought into juxtaposition with the graphene impregnated thermoelectric semiconductor and subsequently transformed from martensitic steel to austenitic steel forming the aforementioned fusion with the carbon that is present after heating. The resulting fusion layer fulfills the requirements for fusing a metal conductor to an active thermoelectric semiconductor with an extremely strong fusion weld without interfering with the thermoelectric semiconductor electrically, and providing a temperature and current tolerant superconducting interface. The process can also be improved by drawing the graphene oxide solution into the grain structure of the thermoelectric semiconductor by application of a vacuum before transformation reduction into graphene carbon.

Embodiments of the present invention provide a method for forming a thermoelectric device assembly comprising layering a first metal substrate against a first graphene coated semiconductor wafer on a first side of the metal substrate; layering a first side of a second graphene coated semiconductor wafer on a second, opposite side of the metal substrate; layering a second metal substrate against the first side of the second graphene coated semiconductor wafer to form a resulting assembly; applying a pressure to the resulting assembly to hold each layer together; heating the resulting assembly to a temperature below the melting temperature of the first and second graphene coated semiconductor wafers to form a fusion bond between each layer, wherein the fusion bond is formed from carbonization of a martensitic to austenitic phase change as the first and second metal substrates absorbs graphene from the first and second graphene coated semiconductor wafers.

Embodiments of the present invention provide a method for forming a thermoelectric device assembly comprising electroplating a first copper substrate and a second copper substrate with a metal layer to form an electroplated metal on the first and second copper substrates; annealing the first and second copper substrates to bond the electroplated metal thereto; layering the first copper substrate against a graphene coated p-type semiconductor wafer on a first side of the first copper substrate; layering a first side of a graphene coated n-type semiconductor wafer on a second, opposite side of the first copper substrate; layering the second copper substrate against the first side of the graphene coated n-type semiconductor wafer to form a resulting assembly; applying a pressure to the resulting assembly to hold each layer together; and heating the resulting assembly to a temperature below the melting temperature of the graphene coated p- and n-type semiconductor wafers to form a fusion bond between each layer, wherein the fusion bond is formed from carbonization of a martensitic to austenitic phase change as the electroplated metal on the first and second copper substrates absorbs graphene from the graphene coated p- and n-type semiconductor wafers.

These and other features, aspects and advantages of the present invention will become better understood with reference to the following drawings, description and claims.

BRIEF DESCRIPTION OF THE DRAWINGS

Some embodiments of the present invention are illustrated as an example and are not limited by the figures of the accompanying drawings, in which like references may indicate similar elements.

Figure 1:
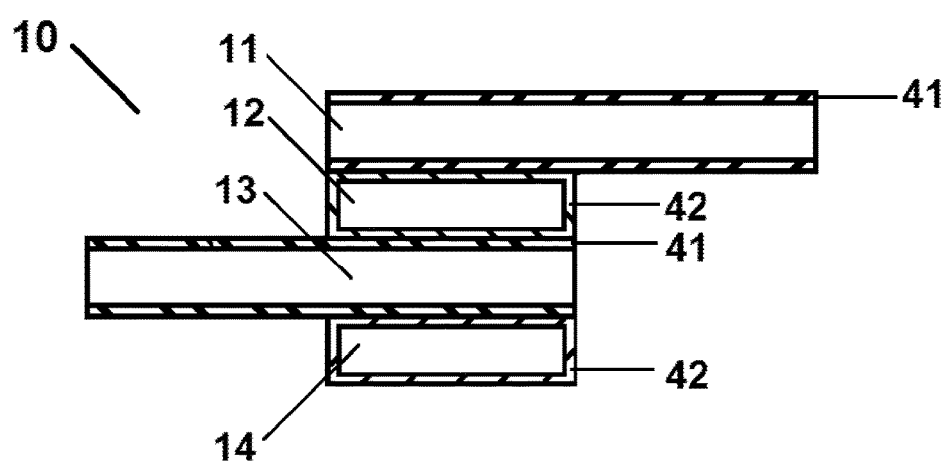
FIG. 1 is a cross-sectional view of a layered structure according to an exemplary embodiment of the present invention.

Unless otherwise indicated illustrations in the figures are not necessarily drawn to scale.

The invention and its various embodiments can now be better understood by turning to the following detailed description wherein illustrated embodiments are described. It is to be expressly understood that the illustrated embodiments are set forth as examples and not by way of limitations on the invention as ultimately defined in the claims.

DETAILED DESCRIPTION OF THE PREFERRED EMBODIMENTS AND BEST MODE OF INVENTION

The terminology used herein is for the purpose of describing particular embodiments only and is not intended to be limiting of the invention. As used herein, the term "and/or" includes any and all combinations of one or more of the associated listed items. As used herein, the singular forms "a," "an," and "the" are intended to include the plural forms as well as the singular forms, unless the context clearly indicates otherwise. It will be further understood that the terms "comprises" and/or "comprising," when used in this specification, specify the presence of stated features, steps, operations, elements, and/or components, but do not preclude the presence or addition of one or more other features, steps, operations, elements, components, and/or groups thereof.

Unless otherwise defined, all terms (including technical and scientific terms) used herein have the same meaning as commonly understood by one having ordinary skill in the art to which this invention belongs. It will be further understood that terms, such as those defined in commonly used dictionaries, should be interpreted as having a meaning that is consistent with their meaning in the context of the relevant art and the present disclosure and will not be interpreted in an idealized or overly formal sense unless expressly so defined herein.

In describing the invention, it will be understood that a number of techniques and steps are disclosed. Each of these has individual benefit and each can also be used in conjunction with one or more, or in some cases all, of the other disclosed techniques. Accordingly, for the sake of clarity, this description will refrain from repeating every possible combination of the individual steps in an unnecessary fashion. Nevertheless, the specification and claims should be read with the understanding that such combinations are entirely within the scope of the invention and the claims.

In the following description, for purposes of explanation, numerous specific details are set forth in order to provide a thorough understanding of the present invention. It will be evident, however, to one skilled in the art that the present invention may be practiced without these specific details.

The present disclosure is to be considered as an exemplification of the invention, and is not intended to limit the invention to the specific embodiments illustrated by the figures or description below.

As is well known to those skilled in the art, many careful considerations and compromises typically must be made when designing for the optimal configuration of a commercial implementation of any system, and in particular, the embodiments of the present invention. A commercial implementation in accordance with the spirit and teachings of the present invention may be configured according to the needs of the particular application, whereby any aspect(s), feature(s), function(s), result(s), component(s), approach(es), or step(s) of the teachings related to any described embodiment of the present invention may be suitably omitted, included, adapted, mixed and matched, or improved and/or optimized by those skilled in the art, using their average skills and known techniques, to achieve the desired implementation that addresses the needs of the particular application.

Figure 2:
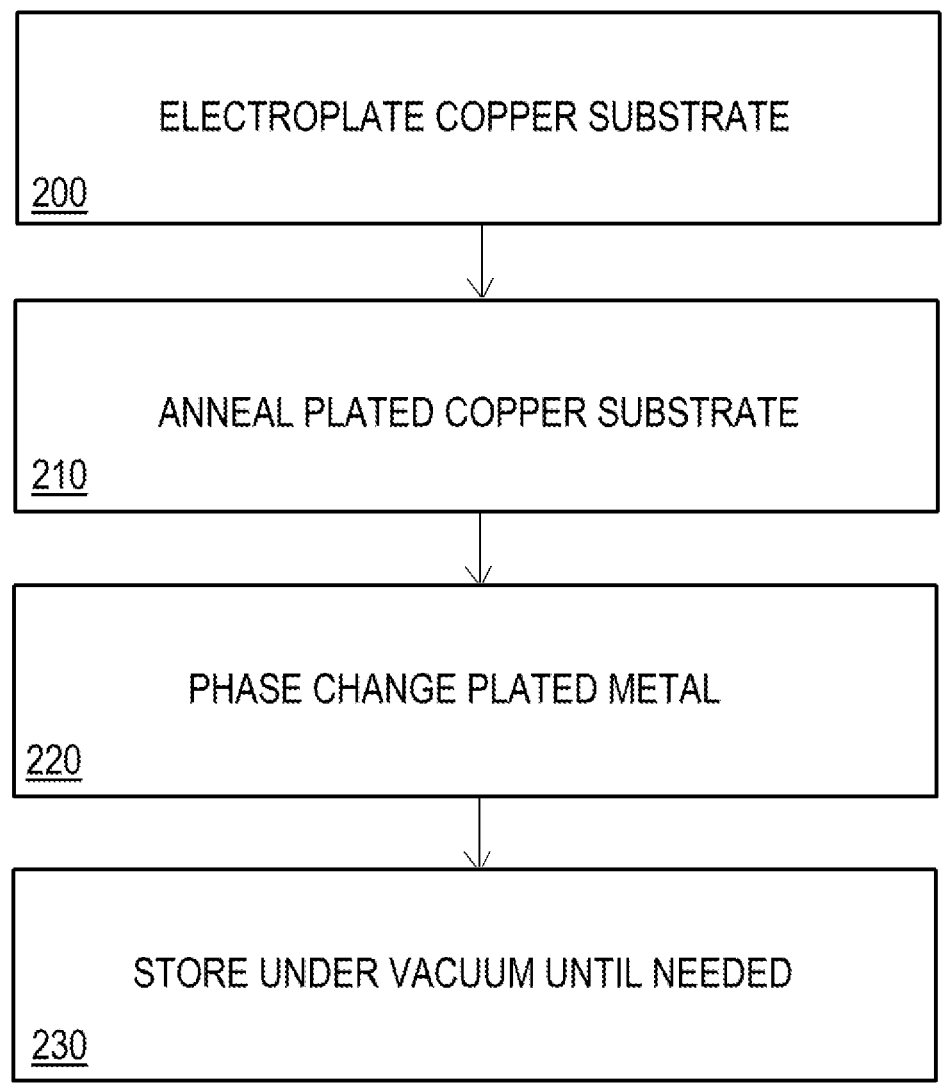
FIG. 2 is a block diagram illustrating the formation of copper paddles according to an exemplary embodiment of the present invention.

Referring now to FIGS. 1 and 2, copper paddles can be prepared. Copper is typically used as the substrate for the hot and cold paddles because of its high conductivity and low electrical resistance, typically on the order of $1 \times 10^{-7}$ to $1 \times 10^{-8}$, for example. It should be noted that copper is usually a contaminate of bismuth-tellurium semiconductors.

According to an embodiment of the present invention, a copper substrate 11, 13 can be cleaned and prepared for electroplating. Various metals can be used for electroplating onto the copper substrate. In this embodiment, in step 200, a nickel/iron (40/60) solution can be used in an electroplating tank to form an electroplating 41 onto the copper substrate 11, 13. It should be noted that nickel and iron is not a contaminate of bismuth-tellurium semiconductors.

Typically, the electroplating can take place for about 3 minutes and, when complete, the electroplated copper substrate can be removed from the tank, rinsed and dried. In step 210, the electroplated copper is annealed to bond the electroplated metal to the copper substrate. In some embodiments, the electroplated copper can be put in a quartz lined tube furnace and annealed for 3 hours at 600 C in a hydrogen atmosphere. The furnace is then allowed to cool to room temperature while under a hydrogen or argon atmosphere.

The electroplated copper is removed from the room temperature furnace and immediately put into liquid nitrogen, typically for about 6 hours, to change the electroplated metal (in this case, the electroplated nickel/iron) from austenitic phase to the martensitic phase in step 220. Finally, in step 230, the electroplated copper is stored under vacuum, such as in vacuum bags, until assembly.

Figure 3:
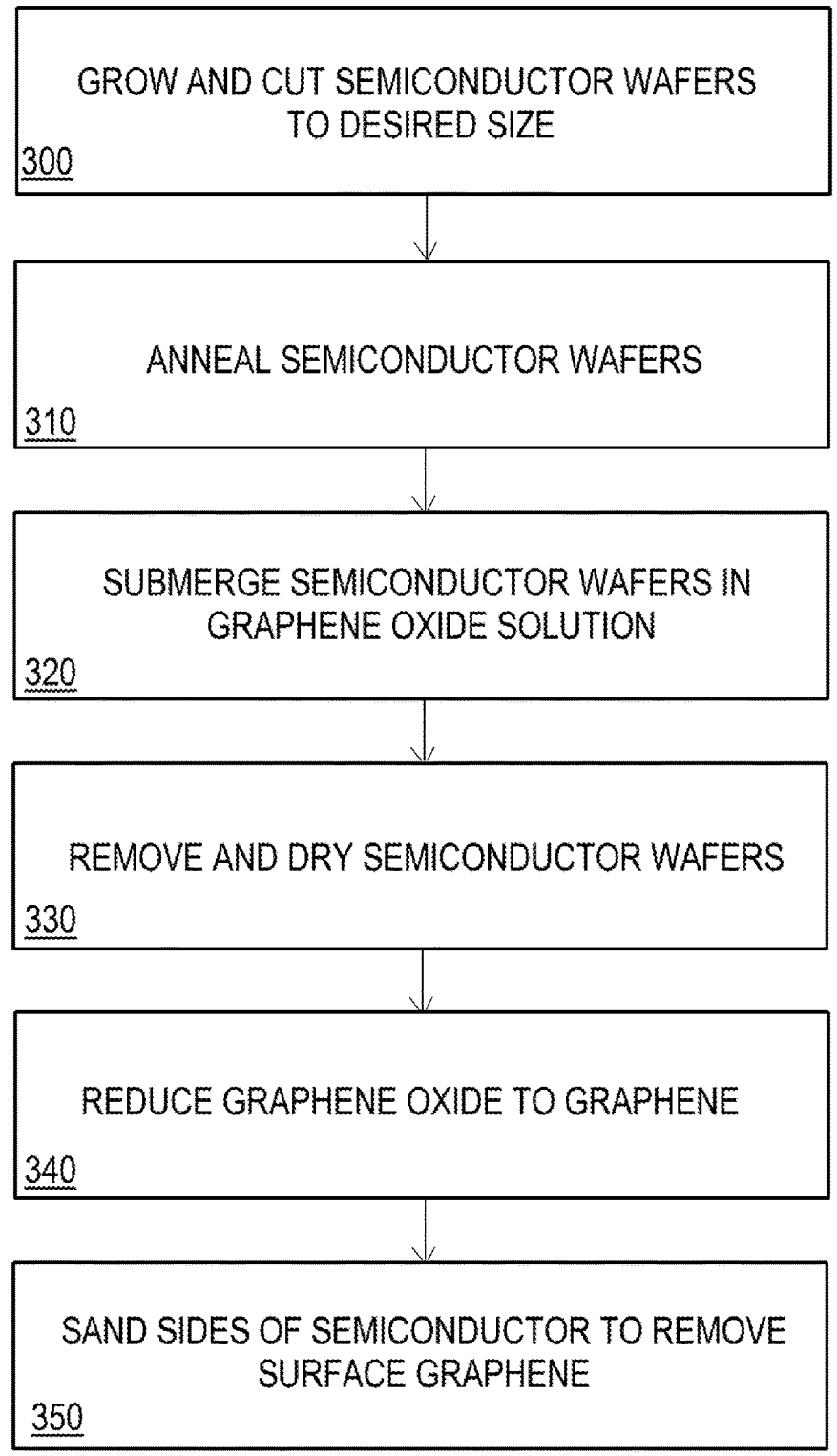
FIG. 3 is a block diagram illustrating the formation of graphene coated semiconductor wafers according to an exemplary embodiment of the present invention.

Referring to FIGS. 1 and 3, thermoelectric semiconductor wafers 12, 14 can be, for example, bismuth-tellurium semiconductors. The thermoelectric semiconductor wafers 12, 14 (also referred to as semiconductors 12, 14 or wafers 12, 14) can be made by various methods, such as the Bridgeman method of crystal growing. Once grown, in step 300, the semiconductor wafers 12, 14 can be cut to the desired size.

In step 310, the semiconductor wafers can be annealed, such as in a hydrogen gas quartz tube at 300-400 C for 3 hours. The annealed wafers are allowed to cool under hydrogen or argon atmosphere to room temperature.

The semiconductor wafers are removed from the annealing furnace and immediately submerged in a solution of distilled water and graphene oxide, in step 320. The graphene oxide may be present at a concentration of 0.01% for example. The solution with the wafers may be placed under a slight vacuum below the vapor pressure of the solution and/or may be placed in a high pressure chamber for 5 hours. This vacuum or pressure can help impregnate the wafer grain boundaries and surface with graphene oxide.

The wafers are then removed from the solution and dried, in step 330, in a chamber of argon at about 50 C for 2 hours. In step 340, the semiconductor wafers are then removed from the drying chamber and are treated with a reducing agent, such as electromagnetic radiation for 15 seconds, to reduce the graphene oxide to graphene. In step 350, the semiconductor wafers are lightly sanded on their four sides to remove surface graphene, leaving surface graphene 42 on the two flat interface surfaces. The semiconductor wafers 12, 14 are now ready for assembly.

Figure 4:
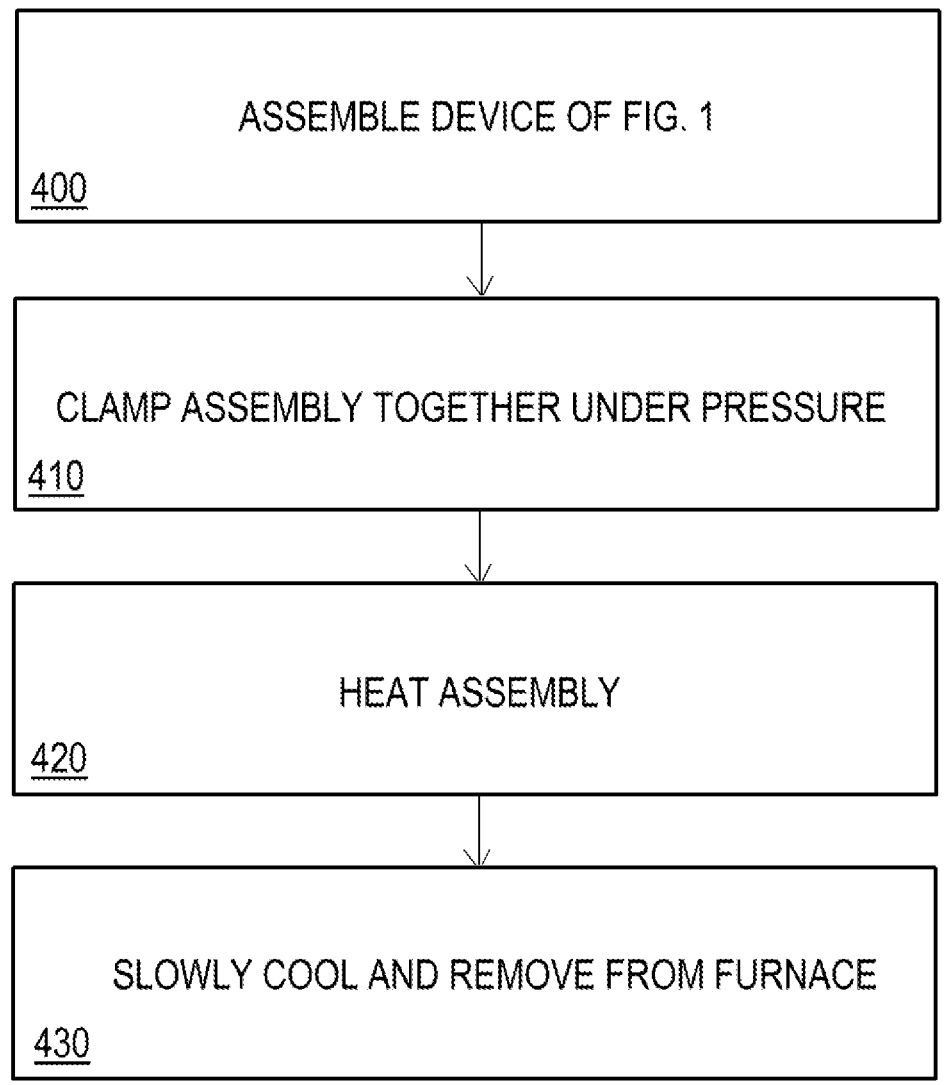
FIG. 4 is a block diagram illustrating the formation of a thermoelectric device assembly according to an exemplary embodiment of the present invention.

Referring now to FIGS. 1 and 4, a thermoelectric device assembly 10 can be assembled as described herein. In step 400, the first copper electroplated nickel/iron plated substrate 11 can be layered with a first p-type semiconductor wafer 12, then another copper substrate 13 and then an n-type semiconductor wafer 14. This makes up one full element of a thermoelectric Seebeck or Peltier device, for example.

In step 410, the thermoelectric device assembly 10 can be clamped together under high pressure with the use of a clamp or a cryogenic treat shape memory alloy that applies pressure in the heating fusion step of the assembly, described below. The clamp or shape memory allow can be insulated from the elements by, for example, a high temperature mica inserted between the clamp and/or shape memory alloy. While FIG. 1 shows a particular cross-section, the device assembly 10 can be made up of many elements and could be in any shape or configuration, such as linear or circular.

In step 420, the entire assembly 10 can be put into a quartz furnace and heated to below the melting temperature of the bismuth-tellurium semiconductors (440-500 C) and held at this temperature for 3-10 hours, with the exact time being determined by trial and error and the desired fusion bond. In step 430, the assembly is then slowly cooled to room temperature and removed from the furnace.

While being heated, the shape memory alloy can shrink, applying pressure to the entire assembly, for example. The fusion bonding takes place in what is known in the heat treating industry as the carbonization of the martensitic to austenitic phase change as the metal absorbs the carbon impregnated semiconductor.

What is normally considered a cold junction of the interfaces of the semiconductor with the copper substrate is now a fusion bond of the semiconductor, nickel/iron and copper. This fusion bond is required for operating a Seebeck thermoelectric device, for example.

The semiconductor junctions formed by the methods of the present invention now super conduct into the copper and the total resistance of the device has the resistance of copper with no loss due to the junctions. In other words, the device total resistance is that of one piece of copper.

The use of conventional low temperature solders is suitable for Peltier devices, but fall far short of operation in high temperature devices because the low temperature solders of today are not considered fusion bonded, but are, in fact, metallic glues that have good electrical conduction suitable for Peltier devices, but no fusion bonding requirement that is needed for good bimetal thermoelectric Seebeck devices.

All the features disclosed in this specification, including any accompanying abstract and drawings, may be replaced by alternative features serving the same, equivalent or similar purpose, unless expressly stated otherwise. Thus, unless expressly stated otherwise, each feature disclosed is one example only of a generic series of equivalent or similar features.

Claim elements and steps herein may have been numbered and/or lettered solely as an aid in readability and understanding. Any such numbering and lettering in itself is not intended to and should not be taken to indicate the ordering of elements and/or steps in the claims.

Many alterations and modifications may be made by those having ordinary skill in the art without departing from the spirit and scope of the invention. Therefore, it must be understood that the illustrated embodiments have been set forth only for the purposes of examples and that they should not be taken as limiting the invention as defined by the following claims. For example, notwithstanding the fact that the elements of a claim are set forth below in a certain combination, it must be expressly understood that the invention includes other combinations of fewer, more or different ones of the disclosed elements.

The words used in this specification to describe the invention and its various embodiments are to be understood not only in the sense of their commonly defined meanings, but to include by special definition in this specification the generic structure, material or acts of which they represent a single species.

The definitions of the words or elements of the following claims are, therefore, defined in this specification to not only include the combination of elements which are literally set forth. In this sense it is therefore contemplated that an equivalent substitution of two or more elements may be made for any one of the elements in the claims below or that a single element may be substituted for two or more elements in a claim. Although elements may be described above as acting in certain combinations and even initially claimed as such, it is to be expressly understood that one or more elements from a claimed combination can in some cases be excised from the combination and that the claimed combination may be directed to a subcombination or variation of a subcombination.

Insubstantial changes from the claimed subject matter as viewed by a person with ordinary skill in the art, now known or later devised, are expressly contemplated as being equivalently within the scope of the claims. Therefore, obvious substitutions now or later known to one with ordinary skill in the art are defined to be within the scope of the defined elements.

The claims are thus to be understood to include what is specifically illustrated and described above, what is conceptually equivalent, what can be obviously substituted and also what incorporates the essential idea of the invention.

What is claimed is:

1. A method for forming a thermoelectric device assembly, comprising:
   layering a first metal substrate against a first graphene coated semiconductor wafer on a first side of the metal substrate;
   layering a first side of a second graphene coated semiconductor wafer on a second, opposite side of the metal substrate;
   layering a second metal substrate against the first side of the second graphene coated semiconductor wafer to form a resulting assembly;
   applying a pressure to the resulting assembly to hold each layer together; and
   heating the resulting assembly to a temperature below the melting temperature of the first and second graphene coated semiconductor wafers to form a fusion bond between each layer, wherein
   the fusion bond is formed from carbonization of a martensitic to austenitic phase change as the first and second metal substrates absorbs graphene from the first and second graphene coated semiconductor wafers.

2. The method of claim 1, wherein the first metal substrate and the second metal substrate are copper substrates.

3. The method of claim 2, wherein the copper substrates are electroplated with a metal to form an electroplated substrate.

4. The method of claim 3, wherein the electroplated metal forms the fusion bond while undergoing the martensitic to austenitic phase change.

5. The method of claim 3, wherein the metal is a 40/60 nickel/iron mixture.

6. The method of claim 3, further comprising immediately after electroplating the metal on the copper substrates, cooling the electroplated substrate to change the metal from austenitic phase to martensitic phase.

7. The method of claim 1, wherein the first and second graphene semiconductor wafers are formed by submerging semiconductor wafers in a graphene oxide solution, removing the semiconductor wafers, drying the semiconductor wafers, and reducing the graphene oxide to graphene.

8. The method of claim 1, further comprising removing graphene from sides of the first and second graphene semiconductor wafers that do not contact the first or second metal substrate.

9. The method of claim 1, wherein the first graphene coated semiconductor is a p-type semiconductor and the second graphene coated semiconductor is an n-type semiconductor.

10. The method of claim 1, wherein the temperature is from about 440 C to about 500 C.

11. A method for forming a thermoelectric device assembly, comprising:
   electroplating a first copper substrate and a second copper substrate with a metal layer to form an electroplated metal on the first and second copper substrates;
   annealing the first and second copper substrates to bond the electroplated metal thereto;
   layering the first copper substrate against a graphene coated p-type semiconductor wafer on a first side of the first copper substrate;
   layering a first side of a graphene coated n-type semiconductor wafer on a second, opposite side of the first copper substrate;
   layering the second copper substrate against the first side of the graphene coated n-type semiconductor wafer to form a resulting assembly;
   applying a pressure to the resulting assembly to hold each layer together; and
   heating the resulting assembly to a temperature below the melting temperature of the graphene coated p- and n-type semiconductor wafers to form a fusion bond between each layer, wherein
   the fusion bond is formed from carbonization of a martensitic to austenitic phase change as the electroplated metal on the first and second copper substrates absorbs graphene from the graphene coated p- and n-type semiconductor wafers.

12. The method of claim 11, wherein the electroplated metal forms the fusion bond while undergoing the martensitic to austenitic phase change.

13. The method of claim 11, wherein the electroplated metal is a 40/60 nickel/iron mixture.

14. The method of claim 11, further comprising immediately after electroplating the metal layer on the first and second copper substrates, cooling the electroplated substrate to change the metal from austenitic phase to martensitic phase.

15. The method of claim 11, wherein the first and second graphene semiconductor wafers are formed by submerging semiconductor wafers in a graphene oxide solution, removing the semiconductor wafers, drying the semiconductor wafers, and reducing the graphene oxide to graphene.

16. The method of claim 15, further comprising removing graphene from sides of the first and second graphene semiconductor wafers that do not contact the first or second metal substrate.

* * * * *